United States Patent [19]

Cowan

[11] Patent Number: 5,408,026

[45] Date of Patent: Apr. 18, 1995

[54] CURABLE AND CURED ORGANOSILICON COMPOSITIONS, AND PROCESS FOR MAKING SAME

[76] Inventor: Patrick J. Cowan, 13 Bernard Blvd., Hockessin, Del. 19707

[21] Appl. No.: 110,685

[22] Filed: Aug. 23, 1993

[51] Int. Cl.⁶ .............................................. C08G 77/08
[52] U.S. Cl. ........................................ 528/15; 528/31; 528/32; 525/478; 525/479
[58] Field of Search .................. 528/15, 32, 31; 525/478, 479

[56] References Cited

U.S. PATENT DOCUMENTS

| | | |
|---|---|---|
| 3,197,432 | 7/1965 | Lamoreaux . |
| 3,197,433 | 7/1965 | Lamoreaux . |
| 3,438,936 | 4/1969 | Lamoreaux . |
| 4,877,820 | 10/1989 | Cowan . |
| 4,900,779 | 2/1990 | Leibfried . |
| 4,902,731 | 2/1990 | Leibfried . |
| 5,008,360 | 4/1991 | Bard et al. . |
| 5,013,809 | 5/1991 | Leibfried . |
| 5,025,048 | 6/1991 | Burnier . |
| 5,068,303 | 11/1991 | Bard et al. . |
| 5,077,134 | 12/1991 | Leibfried . |
| 5,118,735 | 6/1992 | Burnier . |
| 5,124,375 | 6/1992 | Leibfried . |
| 5,124,423 | 6/1992 | Leibfried . |
| 5,147,945 | 9/1992 | Woodside et al. . |
| 5,171,817 | 12/1992 | Barnum et al. . |
| 5,196,498 | 3/1993 | Leibfried . |
| 5,242,949 | 9/1993 | Goldberg et al. . |

OTHER PUBLICATIONS

Kirk–Othmer, Encyclopedia of Chemical Technology, third edition, vol. 12, pp. 795–796 (1984).
Kirk–Othmer, Encyclopedia of Chemical Technology, third edition, vol. 16, pp. 592–593 (1984).
Kirk–Othmer, Concise Encyclopedia of Chemical Technology 1985 ed pp. 123–125.
Crivello et al., "Novel Platinum–Containing Initiators for Ring-Opening Polymerizations", *Journal of Polymer Science: Part A: Polymer Chemistry*, vol. 29, pp. 1853–1863 (1991).

Primary Examiner—Melvyn I. Marquis

[57] ABSTRACT

A curable composition containing (A) a polyene having at least two hydrosilation reactive carbon-carbon double bonds; (B) a cyclic silicon compound, having at least two hydrosilation reactive $\equiv$SiH groups; and (C) a linear silicon compound containing at least two $\equiv$SiH groups, and having the general formula:

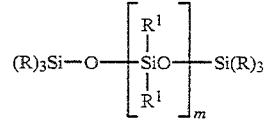

wherein R comprises at least one member selected from a group consisting of hydrogen, a substituted or unsubstituted saturated alkyl radical, and a substituted or unsubstituted phenyl radical, and R' comprises at least one member selected from a group consisting of hydrogen, a substituted or unsubstituted saturated alkyl radical, and a substituted or unsubstituted phenyl radical; m is an integer from about 25 to 1000, at least one R' is hydrogen; and the linear silicon compound is present in an amount of from about 5 to 95 weight percent, based on a total weight of silicon compounds present in the curable composition. The curable composition can contain a prepolymer. A cured composition comprises the reaction product formed upon subjecting the curable composition to conditions for polymerizing the polyene and the silicon compounds.

45 Claims, No Drawings

CURABLE AND CURED ORGANOSILICON COMPOSITIONS, AND PROCESS FOR MAKING SAME

BACKGROUND OF THE INVENTION

1. Field of the Invention

The present invention relates to novel curable and cured organosilicon compositions, and to processes for preparing these compositions.

2. Description of Background and Other Information

LEIBFRIED '779, U.S. Pat. No. 4,900,779, LEIBFRIED '731, U.S. Pat. No. 4,902,731, LEIBFRIED '134, U.S. Pat. No. 5,077,134, and BARD et al '360, U.S. Pat. No. 5,008,360, describe crosslinked organosilicon polymers and crosslinkable organosilicon prepolymers comprising alternating polycyclic hydrocarbon residues and cyclic polysiloxanes or siloxysilane residues linked through carbon to silicon bonds; these patents are incorporated herein in their entireties, by reference thereto. COWAN, U.S. Pat. No. 4,877,820, also incorporated herein in its entirety, by reference thereto, discloses crosslinkable and crosslinked linear poly(organohydrosiloxane) prepolymers and polymers having at least 30% of their hydrosilation reactive ≡SiH groups reacted with hydrocarbon residues derived from polycyclic polyenes.

More specifically, LEIBFRIED '134 discloses certain cyclic siloxanes as comprising mixtures containing up to about 20% (in purer forms as low as 2%) low molecular weight linear siloxanes, such as heptamethyltrisiloxane, octamethyltetrasiloxane, hexamethyl disiloxane, etc. LEIBFRIED '134 also discloses crosslinked polymers comprising alternating polycyclic polyene residues and polysiloxane/siloxysilane residues derived from (i) cyclic polysiloxanes or tetrahedral siloxysilanes, and (ii) linear, short chain ≡SiH terminated polysiloxanes. The preferred linear, short chain ≡SiH terminated polysiloxanes are disclosed as having the general formula:

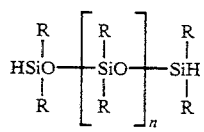

wherein n is 0 to 1000 and R is alkyl or aryl, preferably methyl or phenyl. LEIBFRIED '134 further discloses a preferred method in which polycyclic polyenes and cyclic polysiloxanes or tetrahedral siloxysilanes are used to prepare prepolymers, followed by mixing linear, short chain ≡SiH terminated polysiloxanes with the prepolymer, and curing the mixture in the presence of a hydrosilation catalyst. In this process, the linear, short chain ≡SiH terminated polysiloxanes are used in an amount of 10 to 50% by weight of the polysiloxanes and siloxysilanes added to the preformed olefin reaction product. The linear polysiloxanes are disclosed as imparting flexibility to the cured polymers, and can be used to produce elastomers.

COWAN '820 discloses crosslinked or crosslinkable linear poly(organohydrosiloxane) wherein the crosslinking units are derived from polycyclic polyenes. These polymers are prepared by reacting or partially reacting the poly(organohydrosiloxanes) with polycyclic polyenes in the presence of a hydrosilation catalyst. The resulting polymers are characterized in that the organohydrosiloxane is a linear poly(organohydrosiloxanes) having at least 30% of its ≡SiH groups reacted with hydrocarbon residues derived from polycyclic polyenes. COWAN '820 discloses preferred linear poly(organohydrosiloxanes) of the general formula:

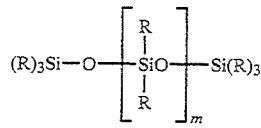

wherein R is a substituted or unsubstituted, saturated alkyl radical or a substituted or unsubstituted phenyl radical, and about 1% to about 50%, preferably 5% to about 50%, of the R's are hydrogen, and m is an integer from about 5 to 1000, preferably 5 to 100, and the maximum value of m is desirably 40.

The polymerization of commercially available linear methylhydrosiloxanes (LMHS) with hydrosilation reactive olefins, such as polycyclic polyenes, to produce silicon carbon reactive polymers (SC reactive polymers), has been hampered in the past due to the low glass transition temperatures ($T_g < 100°$ C.) and low modulus, of the materials produced by reacting LMHS with dienes, such as dicyclopentadiene (DCPD).

SUMMARY OF THE INVENTION

The present invention pertains, in one embodiment, to a curable composition comprising:

(A) a polyene having at least two hydrosilation reactive carbon-carbon double bonds;

(B) a cyclic silicon compound, having at least two hydrosilation reactive ≡SiH groups; and (C) a linear silicon compound having the general formula:

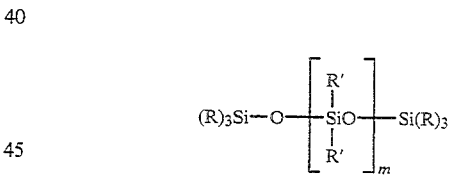

R comprises at least one member selected from the group consisting of hydrogen, a substituted or unsubstituted saturated alkyl radical, and a substituted or unsubstituted phenyl radical, and R' comprises at least one member selected from the group consisting of hydrogen, a substituted or unsubstituted saturated alkyl radical, and a substituted or unsubstituted phenyl radical; m is an integer from about 25 to 1000; at least one R' is hydrogen; the linear silicon compound comprises at least 2 ≡Si—H groups; and, the linear silicon compound is present in an amount of from about 5 to 95 weight percent, based on a total weight of silicon compounds present in the curable composition.

Preferably, the curable composition further comprises a hydrosilation catalyst.

Preferably, the polyene comprises a polycyclic polyene.

Preferably, the cyclic silicon compound comprises at least one member selected from the group consisting of cyclic polysiloxanes having the formula:

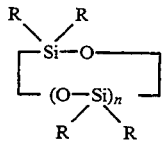

wherein R, which can be the same or different, comprises at least one member selected from the group consisting of hydrogen, a saturated, substituted, or unsubstituted alkyl or alkoxy radical, and a substituted or unsubstituted aromatic or aryloxy radical; n is an integer from 2 to about 20; and, R is hydrogen on at least two of the silicon atoms.

Preferably, in the linear silicon compound, from about 5% to 50% of a total of R and R' are hydrogen.

Preferably, at least one member selected from the group consisting of the polyene, the cyclic silicon compound, and the linear silicon compound, has more than two hydrosilation reactive sites, so that the composition is crosslinkable.

Preferably, in the linear silicon compound, m is an integer from about 25 to 80.

Preferably, in the curable composition according to the present invention, the ratio of hydrosilation reactive carbon-carbon double bonds in the polyene, to ≡SiH groups in the silicon compound, is from about 0.1:1 to about 1.5:1.

Preferably, the polyene in the curable composition comprises dicyclopentadiene, and higher cyclopentadiene oligomers, such as cyclopentadiene trimer (symmetrical and unsymmetrical), cyclopentadiene trimer, etc. Preferably, the linear silicon compound in the curable composition comprises at least one member selected from the group consisting of: trimethylsiloxy-terminated methylhydropolysiloxane, dimethylsiloxy-terminated methylhydropolysiloxane; trimethylsiloxy-terminated dimethylsiloxanemethylhydrosiloxane copolymer, dimethylsiloxy-terminated dimethylsiloxanemethylhydrosiloxane copolymer, trimethylsiloxy-terminated methyloctylsiloxanemethylhydrosiloxane copolymer, dimethylsiloxy-terminated phenylmethylsiloxanemethylhydro-siloxane copolymer, trimethylsiloxy-terminated methylcyanopropyl-siloxanemethylhydrosiloxane copolymer, trimethylsiloxy-terminated 3,3,3-trifluoropropylmethylsiloxane methylhydrosiloxane copolymer, trimethylsiloxy-terminated 3-aminopropylmethyl siloxane-methylhydrosiloxane copolymer, trimethylsiloxy-terminated 2-phenylethylmethyl siloxanemethylhydrosiloxane copolymer, and trimethylsiloxy-terminated 2-(4-methylphenyl)-ethylmethylsiloxane-methylhydrosiloxane copolymer.

Preferably, the linear silicon compound is present in an amount of from about 10 to 90 weight percent, based on a total weight of silicon compounds present in the composition.

The present invention further pertains to a curable composition comprising a crosslinkable organosilicon prepolymer hydrosilation reaction product comprising units derived from (A) a polyene having at least two hydrosilation reactive carbon-carbon double bonds, and (B) at least one member selected from the group consisting of:

(i) a cyclic silicon compound, having at least two hydrosilation reactive ≡SiH groups; and (ii) a linear silicon compound having the general formula:

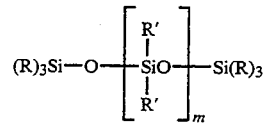

wherein R comprises at least one member selected from a group consisting of hydrogen, a substituted or unsubstituted saturated alkyl radical, and a substituted or unsubstituted phenyl radical, and R' comprises at least one member selected from a group consisting of hydrogen, a substituted or unsubstituted saturated alkyl radical, and a substituted or unsubstituted phenyl radical; m is an integer from about 25 to 1000; at least one R' is hydrogen; and the linear silicon compound comprises at least two ≡SiH groups. The curable composition comprises at least one member selected from the group consisting of the cyclic silicon compound and units derived from the cyclic silicon compound, and at least one member selected from the linear silicon compound and units derived from the linear silicon compound. A sum of the linear silicon compound, and the units derived from the linear silicon compound, is present in an amount of from about 5 to 95 weight percent, based on a total weight of silicon compounds, and units derived from silicon compounds, present in the curable composition.

Preferably, the curable composition further comprises a hydrosilation catalyst.

The present invention further pertains to a cured composition comprising a polymeric hydrosilation reaction product resulting from the polymerization, with or without crosslinking, of a curable composition according to one or more of the above-described curable compositions. Preferably, the cured composition further comprises a hydrosilation catalyst, and preferably the polymeric hydrosilation reaction product is a crosslinked polymer network.

The invention further pertains to a process of preparing a cured composition, comprising combining a polyene having at least two hydrosilation reactive carbon-carbon double bonds, a cyclic silicon compound having at least two hydrosilation reactive ≡SiH groups, and a linear silicon compound having the general formula:

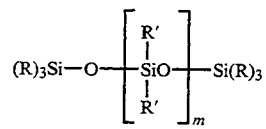

wherein R comprises at least one member selected from a group consisting of hydrogen, a substituted or unsubstituted saturated alkyl radical, and a substituted or unsubstituted phenyl radical, and R' comprises at least one member selected from a group consisting of hydrogen, a substituted or unsubstituted saturated alkyl radical, and a substituted or unsubstituted phenyl radical, and m is an integer from about 25 to 1000, at least one R' is hydrogen, and the linear silicon compound comprises at least two ≡SiH groups, the linear silicon compound being present in an amount of from about 5 to 95 weight percent, based on a total weight of silicon compounds present in the curable composition; and polymerizing the polyene, the cyclic silicon compound, and the linear silicon compound.

Although the polymerization can be carried out with or without crosslinking, preferably the polymerization comprises crosslinking.

Preferably, the polymerization is carried out using a hydrosilation catalyst.

The present invention further pertains to a process for preparing a cured composition from a curable composition comprising a prepolymer comprising units derived from (A) a polyene having at least 2 hydrosilation-reactive carbon-carbon double bonds, and (B) at least one member selected from a group consisting of:

(1) a cyclic silicon compound having at least two hydrosilation reactive $\equiv$SiH groups; and (2) a linear silicon compound having the general formula:

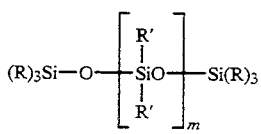

wherein R comprises at least one member selected from the group consisting of hydrogen, a substituted or unsubstituted saturated alkyl radical, and a substituted or unsubstituted phenyl radical, and R' comprises at least one member selected from the group consisting of hydrogen, a substituted or unsubstituted saturated alkyl radical, and a substituted or unsubstituted phenyl radical, and m is an integer from about 25 to 1000, at least one R' is hydrogen, and said linear silicon compound comprises at least two $\equiv$SiH groups. The curable composition comprises at least one member selected from a group consisting of the cyclic silicon compound, and units derived from the cyclic silicon compound, and at least one member selected from a group consisting of the linear silicon compound, and units derived from the linear silicon compound. A sum of the linear silicon compound, and the units derived from the linear silicon compound, is present in an amount of from about 5 to 95 weight percent, based on a total weight of silicon compounds, and units derived from silicon compounds, present in the curable composition. The process comprises polymerizing the curable composition by subjecting the curable composition to a hydrosilation polymerization reaction.

Preferably, the hydrosilation polymerization reaction is carried out using a hydrosilation catalyst.

It has been discovered that the hydrosilation polymerization of a blend of cyclic silicon compounds and certain linear silicon compounds, with olefins, provides process and product advantages over the hydrosilation polymerization of olefins with silicon compounds which do not have this combination of cyclic and linear silicon compounds. The advantages include the ability to tailor the viscosity of the curable composition, so that, for example, the amount of material flashing through the molds is reduced or eliminated. Furthermore, the $T_g$ of the material can be raised by the addition of cyclic polysiloxanes to linear polysiloxanes, in order to produce a stiffer material. Finally, for certain uses, blends of linear and cyclic polysiloxanes perform better than 100% linear polysiloxanes, without having to use 100% cyclic polysiloxanes, e.g. $T_g$ can be maintained within an acceptable range, while using linear polysiloxanes in place of a fraction of the cyclic polysiloxanes.

DESCRIPTION OF THE INVENTION

The term "polyene," as used herein, refers to molecules having at least two carbon-carbon double bonds.

The term "polymer," as used herein, encompasses prepolymers, such as crosslinkable prepolymers, and polymers, such as crosslinked polymers.

The term "prepolymer" as used herein, refers to any viscous liquid or solid hydrosilation crosslinkable composition that has been partially cured, but has not been cured up to or beyond its gel point (gel point is the point at which a material will no longer flow when heated, and is no longer soluble in organic solvents); typically, prepolymers have from 5% to 80% of the available $\equiv$SiH groups reacted, and, in the case of the poly(organohydrosiloxane) prepolymers, as discussed hereinafter, up to 90% of such groups reacted.

The term "crosslinked polymer", as used herein, encompasses the products of curing hydrosilation crosslinkable compositions, as discussed above with reference to the term "prepolymer", up to or beyond such gel point. This term further encompasses crosslinked polymers, as well as at least substantially crosslinked polymers.

The term "crosslinking", as used herein, particularly in the context of the process of the present invention, encompasses the effecting of full crosslinking, as well as the effecting of at least substantially full crosslinking. In this context, "at least substantially full crosslinking" means that approximately 70%, or more, of the $\equiv$SiH groups have been reacted.

The phrase "reaction product", as used herein, particularly in the context of the compositions and processes of the present invention, encompasses the reaction of all of the components which the reaction product comprises, and is not intended to encompass selective reactions of less than all of the recited components.

As used herein, the term "curable" refers to the ability of the composition to be polymerized, either with or without crosslinking, and either with our without complete solvent removal.

As used herein, the phrase "silicon compound" refers to compounds which contain silicon atoms.

As used herein, the phrase "units derived from", as applied herein to cyclic silicon compounds and linear silicon compounds, refers to those portions of the cyclic and linear compounds which, respectively, are present in a polymer or prepolymer after one or more $\equiv$SiH groups of the cyclic or linear silicon compound reacts with a C=C. As applied herein to polyene compounds, the phrase "units derived from" refers to that portion of the polyene compound which is present in a polymer or prepolymer after one or more of the C=C groups reacts with a $\equiv$SiH.

The polyenes suitable for the invention include those having at least two hydrosilation reactive carbon-carbon double bonds. Preferred among such polyenes are the polycyclic polyenes, including those as disclosed in the above-referenced LEIBFRIED '779, LEIBFRIED '731, BARD et al. '360, as well as in LEIBFRIED '809, U.S. Pat. No. 5,013,809, which is also incorporated herein in its entirety, by reference thereto.

Particular appropriate polycyclic polyenes are polycyclic hydrocarbon compounds having at least two non-aromatic carbon-carbon double bonds in their rings. Exemplary compounds include cyclopentadiene oligomers (e.g., dicyclopentadiene, tricyclopentadiene, and tetracyclopentadiene), bicycloheptadiene (i.e., norbornadiene) and its Dieis-Alder oligomers with cyclopentadiene (e.g., dimethanohexahydronaphthalene), norbornadiene dimer, hexahydronaphthalene, and substituted derivatives of any of these, e.g., methyl dicyclopentadienes. Dicyclopentadiene (also referred to herein as DCPD) is preferred. Two or more polycyclic polyenes can be used in combination.

The most preferred polycyclic polyene for use in the present invention is dicyclopentadiene, i.e., most preferably the cured composition comprises repeating units derived from dicyclopentadiene. Dicyclopentadiene may be used as the sole polycyclic polyene in the curable composition of the invention, or the polymerization may be carried out using a mixture of dicyclopentadiene with other polycyclic polyenes in ratios of 1 to 99 mole percent of either monomer, preferably about 40 to 100 mole percent dicyclopentadiene.

The most preferred dicyclopentadiene for use in the present invention is commercially available endodicyclopentadiene (i.e., 3a,4,7,7a-tetrahydro-4,7-methano-1H-indene). The preferred commercially available monomer normally has a purity of at least 97 weight percent and preferably at least 99 weight percent. The preferred commercially available dicyclopentadiene further comprises tricyclopentadiene (i.e., cyclopentadiene trimer) in an amount of from about 0 to 2 weight percent, as well as from about 0 to 2 weight percent of still other norbornene-group containing cycloolefins.

Commercially available dicyclopentadiene should have a purity high enough to prevent impurities from inhibiting the polymerization. The low boiling fraction is preferably removed. This can be done by stripping away several percent of the unsaturated four to six carbon atom volatiles, i.e., the volatiles distilled below 100° C. at about 90±3 torr absolute pressure. It is often desirable to purify the starting material even further, for example with maleic anhydride, optionally followed by treatment with an absorbent such as molecular sieves, alumina or silica gel.

An appropriate polyene is required for obtaining a suitable polycyclic prepolymer for use in the present invention. The prepolymer is preferably flowable and heat curable, and can be obtained from a relatively low temperature reaction. Even though the ratio of hydrosilation reactive carbon-carbon double bonds to hydrosilation reactive ≡SiH groups is otherwise suitable for obtaining the crosslinked polymer, preferred polycyclic polyenes are those having chemically distinguishable hydrosilation reactive carbon-carbon double bonds, i.e., one such bond being more reactive during hydrosilation than the other. Such polycyclic polyenes include, for example, cyclopentadiene oligomers such as dicyclopentadiene, unsymmetrical cyclopentadiene trimer, and methyl dicyclopentadiene.

The cyclic and linear silicon compounds used together in the present invention, i.e., preferably cyclic polysiloxanes and linear polysiloxanes, each require the presence of two or more hydrogen atoms bound to silicon. These cyclic and linear polysiloxanes may be used together and without any additional silicon compounds, or may be used together in combination with other silicon compounds, especially tetrahedral siloxysilanes having two or more hydrogen atoms bound to silicon, particularly tetrahedral siloxysilanes having at least two hydrosilation reactive ≡SiH groups.

Various silicon compounds are disclosed in the above-referenced LEIBFRIED '779, LEIBFRIED '731, LEIBFRIED '134, LEIBFRIED '809, COWAN, and BARD et al. '360, as well as in LAMOREAUX '432, U.S. Pat. No. 3,197,432, LAMOREAUX '433, U.S. Pat. No. 3,197,433, and LAMOREAUX '936, U.S. Pat. No. 3,438,936, which are also incorporated herein in their entireties, by reference thereto.

The cyclic silicon compounds of use in the present invention include cyclic polysiloxanes of the general formula:

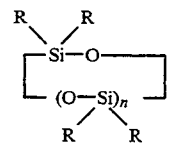

wherein R, which can be the same or different, comprises at least one member selected from the group consisting of hydrogen, or a saturated, substituted, or unsubstituted alkyl or alkoxy radical, or a substituted or unsubstituted aromatic or aryloxy radical, n is an integer from 2 to about 20, and R is hydrogen on at least two of the silicon atoms in the molecule.

The methylhydrocyclosiloxanes (also referred to herein as MHCS), and mixtures thereof, are suitable such cyclic polysiloxanes. Examples include, e.g., tetraoctyl cyclotetrasiloxane, and hexamethyl cyclotetrasiloxane; tetra- and penta-methylcyclotetrasiloxanes; tetra-, penta-, hexa- and hepta-methylcyclopentasiloxanes; tetra-, penta- and hexamethyl-cyclohexasiloxanes, tetraethyl cyclotetrasiloxanes, and tetraphenyl cyclotetrasiloxanes. Preferred are 1,3,5,7-tetramethylcyclotetrasiloxane, 1,3,5,7,9-pentamethylcyclopentasiloxane, and 1,3,5,7,9,11-hexamethylcyclohexasiloxane, or blends thereof.

Most preferably, a plurality of methylhydrocyclosiloxanes are used in the present invention. Specifically, in a majority of cases, what is used is indeed a mixture of a number of species wherein n can vary widely, and reference hereinafter to MHCS refers to such a mixture.

The linear silicon compounds, i.e., preferably, linear polysiloxanes, include those having the general formula:

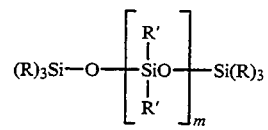

wherein R, which can be the same or different, comprises at least one member selected from the group consisting of hydrogen, a substituted or unsubstituted saturated alkyl radical, a substituted or unsubstituted phenyl radical. R' comprises at least one member selected from the group consisting of hydrogen, a substituted or unsubstituted saturated alkyl radical, a substituted or unsubstituted phenyl radical. At least one R' is hydrogen. In general, m is an integer from about 25 to 1000. Furthermore, the linear silicon compound comprises at least two ≡SiH groups. Preferably, from about 1% to 50%, or more preferably about 5% to 50%, of the R's are hydrogen, and m is an integer from about 25 to 100, preferably about 25 to 80.

Exemplary linear poly(organohydrosiloxanes) include:

trimethylsiloxy-terminated methylhydropolysiloxane;

dimethylsiloxy-terminated methylhydropolysiloxane;

trimethyl siloxy-terminated dimethylsiloxanemethylhydrosiloxane copolymer;

dimethylsiloxy-terminated dimethylsiloxanemethylhydrosiloxane copolymer;

trimethylsiloxy-terminated methyloctylsiloxanemethylhydro-siloxane copolymer;

dimethylsiloxy-terminated methyloctylsiloxanemethylhydrosiloxane copolymer;

dimethylsiloxy-terminated phenylmethylsiloxanemethylhydro-siloxane copolymer;

trimethylsiloxy-terminated methylcyanopropyl-siloxanemethylhydrosiloxane copolymer;

dimethylsiloxy-terminated methylcyanopropyl-siloxanemethylhydrosiloxane copolymer;

trimethylsiloxy-terminated 3,3,3-trifluoropropylmethylsiloxane methylhydrosiloxane copolymer;

dimethylsiloxy-terminated 3,3,3-trifluoropropylmethylsiloxane methylhydrosiloxane copolymer;

trimethylsiloxy-terminated 3-aminopropylmethyl siloxanemethylhydrosiloxane copolymer;

dimethylsiloxy-terminated 3-aminopropylmethyl siloxanemethylhydrosiloxane copolymer;

trimethylsiloxy-terminated 2-phenylethylmethyl siloxanemethylhydrosiloxane copolymer;

dimethylsiloxy-terminated 2-phenylethylmethyl siloxanemethylhydrosiloxane copolymer;

trimethylsiloxy-terminated 2-(4-methylphenyl)-ethylmethyl-siloxane-methylhydrosiloxane copolymer; and dimethylsiloxy-terminated 2-(4-methylphenyl)-ethylmethyl-siloxane-methylhydrosiloxane copolymer.

The use of the linear polysiloxanes disclosed above is commercially advantageous in that such linear polysiloxanes are commercially available, and less expensive than cyclic polysiloxanes.

Supplemental linear polysiloxanes, which may be used in combination with the linear silicon compounds discussed immediately above, include the linear, short chain ≡SiH terminated polysiloxanes having the general formula:

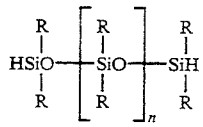

wherein n is 0 to 1000 and R is alkyl or aryl, preferably methyl or phenyl, as disclosed in LEIBFRIED '134 and LEIBFRIED '809. These linear, short chain ≡SiH terminated polysiloxanes impart flexibility to the cured compositions, and can be used to produce elastomers. Such short chain supplemental polysiloxanes, disiloxanes, trisiloxanes, and other short siloxane oligomers, such as hexamethyltrisiloxane, are useful to lower viscosity, particularly for transfer molding operations where low viscosity is most desirable.

Other supplemental silicon compounds which can be used in the present invention include tetrahedral silicon compounds, i.e., tetrahedral siloxysilanes. The tetrahedral siloxysilanes are represented by the general formula:

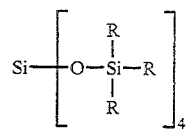

wherein R, which can be the same or different, comprises at least one member selected from the group consisting of hydrogen, or a saturated, substituted, or unsubstituted alkyl or alkoxy radical, or a substituted or unsubstituted aromatic or aryloxy radical, and is hydrogen on at least two silicon atoms in the molecule.

Examples include, e,g., tetrakisdimethylsiloxysilane, tetrakisdiphenylsiloxysilane, and tetrakisdiethylsiloxysilane. Tetrakisdimethylsiloxysilane is the best known and preferred species in this group.

Although the hydrosilation polymerization reaction can be carried out thermally, in the absence of a hydrosilation catalyst, preferably a hydrosilation catalyst is present in the curable compositions of the present invention, for effecting the cure thereof, and thereby obtaining the cured composition of the present invention. The hydrosilation catalyst is preferably provided in an amount of about 20–60 ppm, based on the total weight of the curable composition.

Suitable hydrosilation catalysts include metal salts and complexes of Group VIII elements. Preferred hydrosilation catalysts contain platinum (e.g., $PtCl_2$, dibenzonitrile platinum dichloride, platinum on carbon, etc.).

One such platinum-containing hydrosilation catalyst which is suitable, in terms of both reactivity and cost, is chloroplatinic acid ($H_2PtCl_6.6H_2O$). Also appropriate are the platinum complex of divinyltetramethyldisiloxane, available as PC075 from Huls America, and the platinum-containing catalysts PC072 (a platinum divinyl complex) and PC085, also available from Huls America. One preferred catalyst is a complex of chloroplatinic acid and dicyclopentadiene, as disclosed, for instance, in the above-referenced LEIBFRIED '779, and in BARD et al. '360. Another preferred catalyst is cyclooctadiene platinum dichloride.

Also suitable, as hydrosilation catalysts for curable compositions of the invention, are those as disclosed in CRIVELLO et al., "Novel Platinum-Containing Initiators for Ring-Opening Polymerizations", *Journal of Polymer Science: Part A: Polymer Chemistry*, Vol. 29, pages 1853–1863 (1991), which is hereby incorporated herein in its entirety, by reference thereto.

The curable compositions of the present invention can be prepared by any suitable means, such as conventional mixing of the requisite components.

The curing itself is preferably effected thermally. As one suitable method, the curable composition is degassed under vacuum, with heating, preferably (but not necessarily) conducted in an inert atmosphere, e.g., under nitrogen. Curing effects hydrosilation of carbon-carbon double bonds and ≡SiH groups. Where a crosslinkable curable composition comprising the polyene and the silicon compounds are the starting materials, the polymerization and crosslinking reactions will proceed through to produce a crosslinked polymer, if continued for a sufficient amount of time. If, instead, a crosslinkable prepolymer is employed, it is the as yet unreacted carbon-carbon double bonds and ≡SiH groups thereof which undergo hydrosilation, with the result being further conversion, of the prepolymer, to a crosslinked polymer.

As a first approach, the curable composition comprises a platinum catalyst and the reactants, i.e., including the polyene, the cyclic silicon compound, and the linear silicon compound, as well as any additional components which may be used. These reactants are suitably blended, and then subjected to the preceding curing procedure, until the cured product is formed.

As a second approach, the curable composition comprises a prepolymer. Preferably the prepolymer comprises a crosslinkable prepolymer. Preferably, the prepolymer comprises a crosslinkable organosilicon prepolymer, which may be present alone, or in combination with additional polyene, additional cyclic silicon compound, and/or additional linear silicon compound, which are subjected to the curing procedure together with the prepolymer.

The prepolymer can be prepared using the same hydrosilation catalysts previously discussed as suitable in the curable compositions of the present invention. If the prepolymer is prepared using a sufficient amount of hydrosilation catalyst, a cured composition of the invention can be prepared without additional hydrosilation catalyst. However, if additional hydrosilation catalyst is necessary to effect the desired curing, the curable composition can be provided with additional hydrosilation catalyst.

In general, the crosslinkable organosilicon prepolymers suitable for use in the present invention include prepolymers as disclosed in the above-referenced LEIBFRIED '779, LEIBFRIED '731, LEIBFRIED '134, BARD et al. '360, and COWAN. The crosslinkable prepolymers suitable for the invention also include those prepolymers as disclosed in BARD et al. '303, U.S. Pat. No. 5,068,303, BURNIER '048, U.S. Pat. No. 5,025,048, BURNIER '735, U.S. Pat. No. 5,118,735, LEIBFRIED '498, U.S. Pat. No. 5,196,498, BARNUM et al. '817, U.S. Pat. No. 5,171,817, and in U.S. application Ser. Nos. 07/593,161, filed Oct. 5, 1990, now U.S. Pat. No. 5,242,979 and 07/593,168, filed Oct. 5, 1990, now abandoned; these patents and applications are incorporated herein in their entireties, by reference thereto.

Preferred crosslinkable organosilicon prepolymers are those comprising units derived from:

(a) a polyene having at least two hydrosilation reactive carbon-carbon double bonds; and (b) a silicon compound, having at least two hydrosilation reactive ≡SiH groups, and comprising at least one member selected from the group consisting of cyclic polysiloxanes, tetrahedral siloxysilanes, and linear polysiloxanes;

wherein at least one of the at least one polyene and the at least one silicon compound has more than two hydrosilation reactive sites. The presence of more than 2 hydrosilation reactive sites permits crosslinking of the resulting polymer. Most preferably, the at least one silicon compound has three or more hydrosilation reactive ≡SiH groups.

If the curable composition comprises the prepolymer, and if the curable composition does not comprise unreacted polyene and unreacted silicon compounds, then the prepolymer, or prepolymers, comprise units derived from (A) the polyene, (B) the cyclic silicon compound (or compounds), and (C) the linear silicon compound (or compounds) of the general formula:

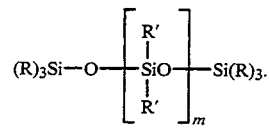

However, if the prepolymer is obtained by reacting the polyene with only the linear silicon compound or only the cyclic silicon compound, the other silicon compound (i.e., the cyclic silicon compound, or linear silicon compound, respectively) can be added to the prepolymer, alone or together with unreacted polyene, prior to the curing step, so that the cured composition comprises units derived from the linear silicon compound, and units derived from the cyclic silicon compound. Suitable polyenes and silicon compounds, for such prepolymers, include those as discussed herein.

If the crosslinkable prepolymers according to the present invention comprise units derived from the linear silicon compounds (as described above), and the cyclic silicon compounds (as described above), and the polyenes (as described above), then a ratio of total hydrosilation reactive carbon-carbon double bonds contributed by the polyene, to hydrosilation reactive ≡SiH groups contributed by both the cyclic silicon compound and the linear silicon compound, is preferably in the range of about 0.1:1 to 1.5:1, more preferably from about 0.5:1 to 1.2:1, still more preferably, from about 0.8:1 to 1.2:1. Most preferably, the ratio is about 1:1.

In these crosslinkable linear poly(organohydrosiloxane) prepolymers, for use in the present invention, as discussed above, preferably, 5% to 90%, more preferably, at least 30%, and, still more preferably, 30% to 85%, of the hydrosilation reactive ≡SiH groups have been reacted with the polyene. Preferred linear poly(organohydrosiloxanes), for the preparation of these linear prepolymers, comprise at least one member selected from the group consisting of:

trimethylsiloxy-terminated methylhydropolysiloxane;

dimethylsiloxy-terminated methylhydropolysiloxane;

trimethylsiloxy-terminated dimethylsiloxanemethylhydrosiloxane copolymer;

dimethylsiloxy-terminated dimethylsiloxanemethylhydrosiloxane copolymer;

trimethylsiloxy-terminated methyloctylsiloxanemethylhydrosiloxane copolymer;

dimethylsiloxy-terminated methyloctylsiloxanemethylhydrosiloxane copolymer;

dimethylsiloxy-terminated phenylmethylsiloxanemethylhydrosiloxane copolymer;

trimethylsiloxy-terminated methylcyanopropylsiloxanemethylhydrosiloxane copolymer;

dimethylsiloxy-terminated methylcyanopropylsiloxanemethylhydrosiloxane copolymer;

trimethylsiloxy-terminated 3,3,3-trifluoropropylmethylsiloxane methylhydrosiloxane copolymer;

dimethylsiloxy-terminated 3,3,3-trifluoropropylmethylsiloxane methylhydrosiloxane copolymer;

trimethylsiloxy-terminated 3-aminopropylmethyl siloxanemethylhydrosiloxane copolymer;

dimethylsiloxy-terminated 3-aminopropylmethyl siloxanemethylhydrosiloxane copolymer;

trimethylsiloxy-terminated 2-phenylethylmethyl siloxanemethylhydrosiloxane copolymer;

dimethylsiloxy-terminated 2-phenylethylmethyl siloxanemethylhydrosiloxane copolymer;

trimethylsiloxy-terminated 2-(4-methylphenyl)-ethyl-methyl-siloxane-methylhydrosiloxane copolymer; and dimethylsiloxy-terminated 2-(4-methylphenyl)-ethyl-methyl-siloxane-methylhydrosiloxane copolymer.

Since linear prepolymers do not comprise any units derived from cyclic silicon compounds, the linear prepolymers are combined with one or more cyclic silicon-containing compounds (or another prepolymer comprising units derived from cyclic silicon containing compounds), usually together with an additional polyene, prior to the polymerization and curing of the composition.

With the exception of the requirement of the use of both cyclic and linear silicon-containing compounds, the crosslinkable prepolymers of the invention can be prepared utilizing the procedures and components, including, but not limited to, process steps and catalysts, as set forth in LEIBFRIED '779, LEIBFRIED '731, LEIBFRIED '134, BARD et al. '360, BARD et al. '303, BURNIER '048, BURNIER '735, COWAN, and BARNUM '817, and in U.S. application Ser. No. 07/593,161, filed Oct. 5, 1990, now U.S. Pat. No. 5,242,979 and U.S. application Ser. No. 07/593,168, filed Oct. 5, 1990, now abandoned. The reactions for forming the prepolymer can be effected thermally, or by the addition of a hydrosilation catalyst or radical generators such as peroxides and azo compounds.

With respect to hydrosilation catalysts, those disclosed herein for use with the curable compositions of the invention, in effecting the cure thereof, are likewise suitable for use in preparation of the prepolymer. For such catalysts which are platinum catalysts, catalyst concentrations of about 0.0005 to about 0.05% by weight of platinum, based on the weight of the monomers, are preferred.

One approach for preparing, as the crosslinkable prepolymer of the invention, a crosslinkable organosilicon prepolymer as previously discussed, is simply to mix a desired ratio of components, i.e., including the polyene, the cyclic silicon compound, the linear silicon-compound, and the platinum catalyst, and thereafter bring the mixture to a temperature at which the reaction is initiated. Proper temperature conditions are thereafter maintained, to drive the reaction to the degree of completion requisite for obtaining the desired prepolymer.

In this regard, the reaction conditions utilized are those which are requisite for obtaining a prepolymer, within the meaning of the term as defined herein, i.e., such polymer being partially cured, but not cured up to or beyond its gel point. For example, the mixture of the components can be maintained at about 30° to 80° C., for several hours, then interrupted at the point where the requisite proportion of available hydrosilation reactive ≡SiH groups have been reacted, e.g., preferably, 5% to 80% thereof. More preferably, this polymerization is effected so that, 30% to 65%, and most preferably, 30% to 55%, of available hydrosilation reactive ≡SiH groups have been reacted.

The prepolymer can be prepared in a two-stage procedure, i.e., by carrying out an initial hydrosilation reaction to form an initial prepolymer and by carrying out a subsequent hydrosilation reaction to form a resulting prepolymer. For example, the polyene used for the preparation of the prepolymer, is itself first prepared in the same manner as the prepolymer. In this regard, the polyene is obtained by heating a mixture of platinum catalyst, the cyclic silicon compound, and/or the linear silicon compound, and a polyene as discussed above as suitable in the hydrosilation reaction. More specifically, the polyene can be prepared in the manner as set forth in LEIBFRIED '134, and LEIBFRIED '809.

In this preparation of the polyene, the relative proportions of initial polyene, the cyclic silicon compound, and the linear silicon compound, are such that there is a large excess of hydrosilation reactive carbon-carbon double bonds available for reaction with the hydrosilation reactive ≡SiH groups; that is, the ratio of hydrosilation reactive carbon-carbon double bonds of initial polyene, to hydrosilation reactive ≡SiH groups of silicon compound, is between about 2:1 and about 10:1. Excess initial polyene which remains after this reaction is removed by any suitable method, such as conventional stripping—e.g., by distillation under vacuum.

In the resulting polyene, the ratio of total hydrosilation reactive carbon-carbon double bonds contributed by the initial polyene, to hydrosilation reactive ≡SiH groups contributed by the silicon compound, is preferably at least about 1.8:1. Still more preferably, this ratio is from about 1.8:1 to 2.2:1; most preferably, it is from about 1.8:1 to 2.0:1.

In the formation of this resulting polyene, the hydrosilation reactive ≡SiH groups, which have been contributed thereto by the silicon compound, are fully, or at least substantially fully, reacted with the hydrosilation-reactive carbon-carbon double bonds which have likewise been contributed by the initial polyene. In this context, "at least substantially fully" means approximately 90%, or more, of the ≡SiH groups have been reacted.

As to such hydrosilation-reactive carbon-carbon double bonds contributed by the initial polyene, those which have not been reacted with the ≡SiH groups, are available for further hydrosilation. The resulting polyene is accordingly provided with at least two hydrosilation-reactive carbon-carbon double bonds.

This resulting polyene can accordingly be used in preparation of the prepolymer, for such curable compositions of the invention which incorporate prepolymer, i.e., for the second approach used to obtain cured product, as previously discussed. Additionally, the resulting polyene is likewise suitable as the polyene, for curable compositions of the invention where the prepolymer is not employed, i.e., for the first approach used to obtain cured product, likewise as previously discussed.

Of those hydrosilation reactive carbon-carbon double bonds contributed, but not reacted with the ≡SiH groups, such hydrosilation reactive carbon-carbon double bonds which are part of the reacted initial polyene, which, in turn, are now part of the resulting polyene, will accordingly be available for reaction with hydrosilation reactive ≡SiH groups of one or more further silicon compounds, in the second stage of the indicated two-stage procedure. The second stage is the preparation of the crosslinkable prepolymer, and can be conducted, with the resulting polyene and additional silicon compounds, in a manner as for preparing crosslinkable organosilicon prepolymer, as previously discussed.

As to the two-stage prepolymer, the ratio of total hydrosilation reactive carbon-carbon double bonds, contributed thereto by the resulting polyene, to hydrosilation reactive ≡SiH groups, contributed thereto by the further silicon compound, is preferably also the same as previously discussed with respect to preparation of crosslinkable organosilicon prepolymer, preferably from about 0.1:1 to 1.5:1, or, more preferably, from about 0.5:1 to 1.2:1, or, still more preferably, from about 0.8:1 to 1.2:1, and, most preferably, about 1:1.

Particularly as to preparing the crosslinkable linear poly(organohydrosiloxane) prepolymer of the invention, as discussed herein, platinum catalyst and polycyclic polyene are mixed and heated to form a complex. This complex is thereafter combined with the poly(organohydrosiloxane), and, with respect to the previously discussed organosilicon prepolymer, suitable reaction conditions are utilized to obtain the requisite prepolymer.

In the preparation of the prepolymer, the reaction mixture is preferably heated from about 40° to 80° C. As previously discussed with reference to preparation of the organosilicon crosslinkable prepolymer, this reaction temperature is maintained for several hours, then interrupted at a point at which the requisite proportion of available hydrosilation reactive $\equiv$SiH groups have been reacted, preferably, for the poly(organohydrosiloxane) prepolymer, 5% to 90% thereof. More preferably, the polymerization is effected so that 30% to 60%, of the available hydrosilation reactive $\equiv$SiH groups have been reacted.

Yet further components, other than those previously specified, may be included in the invention. These components may be provided to the curable compositions of the invention, and/or, if a prepolymer is employed, in the preparation of the prepolymer, depending upon the properties of the components of the prepolymer. It is understood that those particular additional components, which are specifically discussed, are not provided by way of limitation, and that yet others, not specifically described, may also be suitable.

For instance, the "second silicon compound" as disclosed in LEIBFRIED '498, is a suitable such additional component. This component is particularly noted as one which can be provided to curable compositions of the invention as a starting material, and/or employed in preparation of prepolymer.

Other yet additional further components include reaction rate modifiers, as disclosed in the above-referenced U.S. application Ser. No. 07/593,168, filed Oct, 5, 1990, now abandoned, as well as in U.S. application Ser. No. 07/764,829, filed Sep. 24, 1991, U.S. Pat. No. 5,340,644, also incorporated herein in its entirety, by reference thereto.

The curable composition may optionally further comprise additional components which may be used, such as reinforcing agents (e.g., fibers), fillers, antioxidants, flame retardants, elastomers, pigments, reaction rate modifiers, other monomers, oligomers, or prepolymers, and/or polymers. These additional components can be suitably blended, then subjected to the curing procedure (as described above), in the preparation of the cured composition of the present invention.

The reactive component in the curable composition may comprise a prepolymer (as discussed above), and still more preferably, a crosslinkable prepolymer, and more preferably, a crosslinkable organosilicon prepolymer. In a particularly preferred embodiment of the curable composition of the present invention, the polyene and silicon compound are provided in the form of the indicated crosslinkable organosilicon prepolymer, prepared by hydrosilation from reactants comprising a polyene and a silicon compound. This curable prepolymer may then be further combined with a platinum catalyst, and may further comprise additional components, for example, reinforcing agents, etc., as discussed further below. All of these components can be present during the curing step.

In the preparation and curing of curable compositions comprising a prepolymer, the same hydrosilation catalysts as previously discussed for the polymerization of the polyene and the silicon compound, are generally suitable for carrying out the curing step. If a sufficient amount of the hydrosilation catalyst is used in the preparation of the prepolymer, the continuing presence of the hydrosilation catalyst in the resulting curable composition can be adequate to effect curing of the prepolymer, without requiring further addition of hydrosilation catalyst. Alternatively, if necessary, the curable composition can be provided with additional hydrosilation catalyst.

Further optional components for the curable and cured compositions of the present invention include flame retardants, as disclosed in U.S. application Ser. No. 07/893,610, filed Feb. 21, 1992, now abandoned. This application is incorporated herein in its entirety, by reference thereto.

As yet further examples of additional components, carbon (graphite), quartz, aramid, and other polymeric fibers may be included in the curable compositions of the invention; these materials are wetted by the liquid prepolymers of the invention, making them excellent matrix materials. Fiber can be in non-woven, unidirectional, woven, fabric, etc., form; suitable fibers and prepregs include those as discussed in BARD '360.

Additives such as fillers and pigments are also readily incorporated. Vermiculite, mica, wollastonite, calcium carbonate, sand, silica, fumed silica, fused silica, ceramic beads, hollow glass, glass spheres, glass beads, ground glass, waste glass and other mineral fillers are examples of fillers which can be incorporated. Fillers can serve either as reinforcement or as fillers and extenders to reduce the cost of the molded product; glass spheres, in particular, are useful for preparing low density composites. Fillers can also be used for other reasons, such as viscosity modification. Fillers can be present in amounts up to about 15% by weight of the curable compositions of the invention, and in even higher amounts, i.e., up to about 90% by weight, when glass fibers are not used.

Stabilizers (anti-oxidants) are useful to maintain storage stability of the prepolymers, in curable compositions of the invention, and thermal oxidative stability, of the finally cured products. Examples include bis(1,2,2,6,6-pentamethyl-4-piperidinyl)-(3,5-di-tert-butyl-4-hydroxybenzyl)butylpropanedioate (available as Tinuvin TM 144 from Ciba-Geigy Corp., Hawthorne, N.Y.), or a combination of octadecyl 3,5-di-tert-butyl-4-hydroxyhydrocinnamate (also known as octadecyl 3-(3',5'-di-tert-butyl-4'-hydroxyphenyl) propionate) (available as Naugard TM 76 from Uniroyal Chemical Co., Middlebury, Conn.) and bis(1,2,2,6,6-pentamethyl-4-piperidinyl-sebacate) (available as Tinuvin TM 765 from Ciba-Geigy Corp.). Stabilizers are generally used in an amount of about 0.5% to about 3.0%, based on the weight of the prepolymer of the curable composition. Generally, the stabilizers can be employed as disclosed in BURNIER '048, and in BURNIER '735.

One or more elastomers can also be added to improve toughness. Preferred are hydrocarbon elastomers having a molecular weight of less than 100,000, and low molecular weight siloxane elastomers. Exemplary hydrocarbon elastomers are low molecular weight ethylene-propylene-diene terpolymers, low molecular weight butyl rubber, partially hydrogenated low molecular weight polyisoprene or natural rubber, and partially hydrogenated low molecular weight polybutadiene or styrene-butadiene copolymers. Exemplary siloxane elastomers include low molecular weight vinyl or SiH terminated polydimethyl/diphenyl siloxane copolymers. Preferred are low molecular weight ethylene-propylene-dicyclopentadiene and ethylene-propylene-ethylidenenorbornene polymers having a molecular weight of 5500 to 7000. Most preferred are Trilene 65 elastomer, and Trilene 67 elastomer, both of which are available from Uniroyal Chemical Co. The elastomer or elastomers are generally used in an amount of 0.5 to 20%, preferably 3 to 12%, and most preferably 5 to 10%, by weight of the total composition; higher levels may be useful in some applications. Generally, elastomers can be employed as disclosed in the above-referenced U.S. application Ser. No. 07/593,161, filed Oct. 5, 1990, U.S. Pat. No. 5,242,979, and the BARNUM et al. '817 Patent.

Generally, the relative proportions and different types of components, for use in the curable and cured compositions of the invention, these can be determined without undue experimentation, by those of ordinary skill in the art, according to a variety of factors. Such factors include, but are not limited to, the compatibility of such components, whether they will react with one another, and, where they will react with one another, the stoichiometry of the reactions which occur. Still additional factors concern the properties desired in the curable composition and cured product.

In this regard, one set of proportions to consider is the ratio of total hydrosilation reactive carbon-carbon double bonds, to total hydrosilation reactive $\equiv$SiH groups, ultimately contributed from all sources, e.g., polyene, cyclic silicon compound, and linear silicon compound, for preparation of the compositions of the invention, whether contributed to preparation of the prepolymer, or to the final, cured product. This ratio is preferably in a range of from about 0.1:1 to 1.5:1; more preferably, this ratio is in a range of from about 0.5:1 to 1.2:1; still more preferably, this ratio is in a range of from about 0.8:1 to 1.2:1. Most preferably, this ratio is about 1:1.

The compositions of this invention have utility for electronic applications, e.g., composites, adhesives, encapsulants, potting compounds, and coatings. They are especially useful for the preparation of prepregs and laminates such as those used for printed circuit boards, and glob top encapsulants and molding compounds for encapsulation.

For preparing prepregs and laminates, utilizing compositions of the invention, the procedures as disclosed in the above-referenced BARD et al. '360 Patent, U.S. application Ser. No. 07/593,168, filed Oct. 5, 1990, now abandoned, and U.S. application Ser. No. 07/764,829, filed Sep. 24, 1991, U.S. Pat. No. 5,340,644, may be employed.

With respect to preparation of prepregs, utilizing curable compositions of the invention provided with prepolymer as a starting material, a suitable procedure includes forming the prepreg by impregnating reinforcement fibers (e.g., glass fabric) with the curable composition, or pouring the curable composition over such reinforcement. Then, preferably, the treated reinforcement is cured to the point where the composition of the invention is substantially solid, and, most preferably, also at least substantially tack free; however, prepregs so obtained, but which are not tack free, are also within the scope of the invention.

Where the curable composition of the invention utilizes the polyene, the cyclic silicon compound, and the linear silicon compound, alone, or in or with a prepolymer in the preparation of a prepreg, the curable composition is first partially cured, to obtain a liquid (preferably viscous), semisolid, or solid composition. It is this composition which is employed with the reinforcing material(s), with prepreg preparation otherwise being effected according to the procedure set forth above.

In a suitable procedure for obtaining laminates, individual plies of prepregs are stacked, and laminated under heat and pressure, in a hydraulic press. Further cure, of the composition of the invention, is obtained in this treatment.

The invention is illustrated by the following Examples, which are provided for the purpose of representation, and are not to be construed as limiting the scope of the invention. Unless stated otherwise, all percentages, parts, etc. are by weight.

Preparation of Dicyclopentadiene for Examples 1–14

1000 Grams of dicyclopentadiene (DCPD, from Maruzen Petrochemical, of Tokyo, Japan) are mixed with 0.50 grams of maleic anhydride (from Aldrich Chemical of Milwaukee, Wis.) at 50° C. for 1 hour under an inert ($N_2$) atmosphere. The resulting solution is passed through an activated alumina column (from LaRoche Chemicals, Inc. of Baton Rouge, La.) and stored under an inert ($N_2$) atmosphere.

EXAMPLES 1–4

The following procedure is used to prepare the prepolymers used in Examples 1–4.

Preparation of Cyclic Siloxanes

The cyclic siloxanes are prepared by distilling SF 1229, (obtained from GE Silicones, of Waterford, N.Y.), at a reduced pressure, to obtain a 50/50 wt./wt. mixture of tetramethyltetrasiloxane and pentamethylsiloxane.

Preparation of Catalyst Solution A

A catalyst solution is prepared by heating under an inert atmosphere ($N_2$) 3036.18 grams DCPD and 31.45 grams of chloroplatinic acid, obtained from Strem Chemicals, Inc., of Newburyport, Mass., at 70° C. for two hours.

Prepolymer Preparation

A B-blend is prepared by mixing in an inert atmosphere ($N_2$) DCPD, toluene, and Catalyst Solution A, described above. The amounts, based on weight, are provided in Table 1, below.

Prepolymers are prepared by adding B-blend to a preheated (70° C.) mixture of cyclic siloxanes, the mixture comprising: PS 120, obtained from Huls America, of Piscataway, N.J.; Naugard 76, obtained from Uniroyal Chemical, of Naugatuck, Conn.; and Tinuvin 785, obtained from Ciba-Geigy, of Hawthorne, N.Y. The amounts of the various ingredients, and polymerization characteristics, are provided in Table 2, below. The prepolymers are prepared in an oxygen/nitrogen atmosphere (3% $O_2$).

Viscosities are taken of the resulting reaction mixture, without removing the toluene.

Cured products are prepared by adding an amount of activation catalyst (PC072, obtained from Huls America, of Piscataway, N.J.) given in Table 3 to the prepolymer solution, and removing the toluene at 50° under reduced pressure. The resulting prepolymer is cured for 2 hours at 150° C. and 4 hours at 250° C., to produce a crosslinked, cured reaction product. The $T_g$'s of all examples are obtained by thermal mechanical analysis.

TABLE 1

| | Prepolymer Preparation Formulations | | | |
|---|---|---|---|---|
| | Prepolymer Example No. | | | |
| Reagent | 1 | 2 | 3 | 4 |
| cyclic siloxane | 0 | 25 | 37.50 | 50 |
| PS 120 | 100 | 25 | 12.50 | 0 |
| DCPD | 101.08 | 50.73 | 50.82 | 50.91 |
| Catalyst A | 1.34 | 0.68 | 0.68 | 1.02 |
| Toluene | 51.65 | 25.87 | 25.90 | 25.92 |
| Naugard 76 | 3.76 | 1.88 | 1.88 | 1.88 |
| Tinuvin 785 | 0.76 | 0.38 | 0.38 | 0.38 |

TABLE 2

| Example No. | MHCS/LMHS wt %/wt % | ppm Pt B-stage | Solution Resin Viscosity (cSt) | Activation ppm Pt (PC072) | Gel Time (@ 158° C.) | Reaction Product $T_g$ (°C.) |
|---|---|---|---|---|---|---|
| 1 | 0/100 | 20 | 440 | 0 | 1'03" | 62.9 |
| 2 | 50/50 | 20 | 85 | 0 | 2'45" | 83.7 |
| 3 | 75/25 | 20 | 37 | 0 | 6'32" | 117.4 |
| 3a | 75/25 | — | — | 21 | 0'53" | 141.9 |
| 4 | 100/0 | 30 | 6 | 0 | 9'36" | 136.4 |
| 4a | 100/0 | — | — | 21 | 1'16" | 149.9 |

The results presented in Table 2, above, indicate that crosslinked, cured reaction products prepared from activated prepolymer-containing blends of cyclic and linear siloxanes with polyenes, offer physical properties comparable to such cured reaction products containing MHCS alone.

Examples 5–14, set forth below, illustrate a more preferred embodiment of the present invention.

EXAMPLES 5–9

The following procedures are used to prepare the prepolymers in Examples 5–9.

B-Blend Preparation

A B-blend is prepared by mixing in an inert atmosphere ($N_2$) 491.54 grams of a 6% solution of DCPD in toluene, 193.97 grams of toluene, and 2.87 grams of a 2500 ppm Pt methylethyl ketone solution of cyclooctadiene platinumdichloride ([COD]$PtCl_2$), obtained from Degussa Corporation, of South Plainfield, N.J.

Prepolymer Preparation

Prepolymers are prepared by adding the B-blend, as described immediately above, to a preheated (70° C.) mixture of siloxanes (known as 54M10 and 54M20, both of which are obtained from PCR Corp., of Gainesville, Fla., and 1107, from Dow Corning, of Midland, Mich.), the weights of which are provided in Table 3 (below), in an oxygen/nitrogen atmosphere (3% $O_2$). After the prepolymer is formed, Naugard 76, from Uniroyal Chemical, of Naugatuck, Conn., Tinuvin 785, from Ciba-Geigy, of Hawthorne, N.Y., and a 1% solution of diethylene triamine (DETA, from Aldrich Chemical of Milwaukee, Wis.) in toluene are added.

Viscosities are determined after removing the toluene at 50° C. (i.e., via rotary evaporator), at a reduced pressure.

Cured products are prepared by adding an amount of activation catalyst (a 2500 ppm Pt solution of [COD]$PtCl_2$ in methylethyl ketone), as provided in Table 4, to the prepolymer solution, and removing the toluene at 50° under reduced pressure. The resulting prepolymer is cured for 2 hours at 150° C. and 4 hours at 250° C., to produce a crosslinked, cured reaction product. The $T_g$'s of all examples are obtained by thermal mechanical analysis.

TABLE 3

| | Prepolymer Preparation Formulations | | | | |
|---|---|---|---|---|---|
| | Prepolymer Example No. | | | | |
| Reagent | 5 | 6 | 7 | 8 | 9 |
| 54M10 | 0 | 7.61 | 15.22 | 22.82 | 30.43 |
| 54M20 | 0 | 7.71 | 15.42 | 23.14 | 30.84 |
| 1107 | 63.94 | 47.95 | 31.97 | 15.98 | 0 |
| B-Blend | 98.34 | 98.34 | 98.34 | 98.34 | 98.34 |
| Naugard 76 | 2.55 | 2.55 | 2.55 | 2.55 | 2.55 |
| Tinuvin 785 | 0.52 | 0.52 | 0.52 | 0.52 | 0.52 |
| 1% DETA | 0.10 | 0.10 | 0.10 | 0.10 | 0.10 |

TABLE 4

| Example No. | MHCS/LMHS wt %/wt % | ppm Pt B-stage | Neat Resin Viscosity (cSt) | Activation ppm Pt (PC072) | Gel Time (@ 158° C.) | Reaction Product $T_g$ (°C.) |
|---|---|---|---|---|---|---|
| 5 | 0/100 | 8 | gel | — | — | — |
| 6a | 25/75 | 8 | 98,050 | 30 | 1'22" | 124.3 |
| 6b | 25/75 | 8 | 98,050 | 75 | 0'53" | 126.8 |
| 7a | 50/50 | 8 | 21,083 | 30 | 1'58" | 147.6 |
| 7b | 50/50 | 8 | 21,083 | 75 | 1'25" | 159 |
| 8a | 75/25 | 8 | 5,518 | 30 | 3'25" | 185.8 |
| 8b | 75/25 | 8 | 5,518 | 75 | 2'35" | 180.9 |
| 9a | 100/0 | 8 | 1,002 | 30 | 5'42" | 188.2 |
| 9b | 100/0 | 8 | 1,002 | 75 | 3'23" | 210.7 |

EXAMPLES 10–14

The following procedures are used to prepare the prepolymers in Examples 10–14.

B-Blend Preparation

A B-blend is prepared by mixing, in an inert ($N_2$) atmosphere, 386.20 grams of a 6% solution of DCPD in toluene, 277.86 grams of toluene, and 2.26 grams of a 2500 ppm Pt methylethyl ketone solution of cyclooctadiene platinumdichloride ([COD]$PtCl_2$), obtained from Degussa Corporation, of South Plainfield, N.J.

Cyclic Siloxane Blend Preparation

A master solution of cyclic siloxane is prepared by mixing 496.60 grams of 54M10 and 503.40 grams of 54M20, both from PCR Corporation, of Gainesville, Fla.

Prepolymer Preparation

Prepolymers are prepared by adding the B-blend, as described immediately above, to a preheated (70° C.) mixture of the cyclic siloxane blend (described immediately above) and DF1040, from GE Silicones, of Waterford, N.Y., the weights of which are given in Table 5, in an oxygen/nitrogen atmosphere (3% $O_2$). After the prepolymer is formed, Naugard 76, from Uniroyal Chemical, of Naugatuck, Conn., Tinuvin 785, from Ciba-Geigy, of Hawthorne, N.Y., and a 1% solution of diethylene triamine (DETA, from Aldrich Chemical of Milwaukee, Wis.) in toluene, and a 40% solution of Trilene 65, from Uniroyal Chemical, of Middlebury, Conn., are added.

Viscosities are determined after removing the toluene at 50° C. (i.e., via rotary evaporator), at a reduced pressure.

Cured products are prepared by adding an amount of activation catalyst (a 2500 ppm Pt solution of

[COD]PtCl₂ in methylethyl ketone), as provided in Table 6, to the prepolymer solution, and removing the toluene at 50° under reduced pressure. The resulting prepolymer is cured for 2 hours at 150° C. and 4 hours at 250° C., to produce a crosslinked, cured reaction product.

TABLE 5
Prepolymer Preparation Formulations

| Reagent | Prepolymer Example No. | | | | |
|---|---|---|---|---|---|
| | 10 | 11 | 12 | 13 | 14 |
| Cyclic Siloxane | 0 | 15.32 | 30.64 | 45.96 | 61.27 |
| DF1040 | 62.77 | 47.08 | 31.39 | 15.69 | — |
| B-Blend | 121.50 | 121.50 | 121.50 | 121.50 | 121.50 |
| 1% DETA | 0.10 | 0.10 | 0.10 | 0.10 | 0.10 |
| Tinuvin 765 | 0.52 | 0.52 | 0.52 | 0.52 | 0.52 |
| Naugard 76 | 2.55 | 2.55 | 2.55 | 2.55 | 2.55 |
| Trilene 65 solution | 22.87 | 22.87 | 22.87 | 22.87 | 22.87 |

TABLE 6

| Example No. | MHCS/ LMHS wt %/ wt % | ppm Pt B-stage | Neat Resin Viscosity (cSt) | Activation ppm Pt (PC072) | Gel Time (@ 158° C.) | Reaction Product $T_g$ (°C.) |
|---|---|---|---|---|---|---|
| 10 | 0/100 | 8 | (too viscous to pour) | — | 0'10" | — |
| 11 | 25/75 | 8 | 50,097 | 75 | 0'55" | 143 |
| 12 | 50/50 | 8 | 22,000 | 75 | 1'20" | 171.2 |
| 13 | 75/25 | 8 | 5,943 | 75 | 2'03" | 186.9 |
| 14 | 100/0 | 8 | 3,050 | 75 | 2'35" | 213.9 |

The results presented above in Tables 4 and 6, i.e., Examples 5–14, show that the addition of relatively small amounts of cyclic siloxanes to linear siloxanes result in the prevention of gellation of a prepolymer made therefrom.

Finally, although the invention has been described with reference of particular means, materials and embodiments, it is to be understood that the invention is not limited to the particulars disclosed and extends to all equivalents within the scope of the claims.

What is claimed is:

1. A curable composition comprising:
   (A) a polyene having at least two hydrosilation reactive carbon-carbon double bonds;
   (B) a cyclic silicon compound, having at least two hydrosilation reactive ≡SiH groups; and
   (c) a linear silicon compound having the general formula:

$$(R)_3Si-O-\left[\begin{array}{c} R' \\ | \\ SiO \\ | \\ R' \end{array}\right]_m -Si(R)_3$$

wherein R comprises at least one member selected from the group consisting of hydrogen, a substituted or unsubstituted saturated alkyl radical, and a substituted or unsubstituted phenyl radical, and R' comprises at least one member selected from the group consisting of hydrogen, a substituted or unsubstituted saturated alkyl radical, and a substituted or unsubstituted phenyl radical, and m is an integer from about 25 to 1000, at least one R' is hydrogen, and said linear silicon compound comprises at least two ≡SiH groups, and said linear silicon compound is present in an amount of from about 5 to 95 weight percent, based on a total weight of silicon compounds present in said curable composition.

2. The curable composition according to claim 1, further comprising a hydrosilation catalyst.

3. The curable composition according to claim 2, wherein:
   said polyene comprises a polycyclic polyene;
   said cyclic silicon compound having the formula:

$$\left[\begin{array}{c} R \quad R \\ \diagdown \diagup \\ Si-O \\ \diagup \diagdown \\ R \quad R \end{array} (O-Si)_n \right]$$

wherein R, which can be the same or different, comprises at least one member selected from the group consisting of hydrogen, a saturated, substituted, or unsubstituted alkyl or alkoxy radical, and a substituted or unsubstituted aromatic or aryloxy radical; n is an integer from 2 to about 20; and R is hydrogen on at least two of the silicon atoms; and
   in said linear silicon compound, from about 5% to 50% of a total of R and R' are hydrogen.

4. The curable composition according to claim 3, wherein at least one member selected from the group consisting of said polyene, said cyclic silicon compound, and said linear silicon compound, has more than two hydrosilation reactive sites.

5. The curable composition according to claim 4, wherein m is an integer from about 25 to 80.

6. The curable composition according to claim 4, wherein a ratio of hydrosilation reactive carbon-carbon double bonds in the polyene, to ≡SiH groups in said cyclic silicon compound and said linear silicon compound, is from about 0.1:1 to about 1.5:1.

7. The curable composition according to claim 4, wherein the polycyclic polyene comprises dicyclopentadiene.

8. The curable composition according to claim 7, wherein said linear silicon compound comprises at least one member selected from the group consisting of:
   trimethylsiloxy-terminated methylhydropolysiloxane;
   dimethylsiloxy-terminated methylhydropolysiloxane;
   trimethylsiloxy-terminated dimethylsiloxanemethylhydrosiloxane copolymer;
   dimethylsiloxy-terminated dimethylsiloxanemethylhydrosiloxane copolymer;
   trimethylsiloxy-terminated methyloctylsiloxanemethylhydro-siloxane copolymer;
   dimethylsiloxy-terminated methyloctylsiloxanemethylhydro-siloxane copolymer;
   dimethylsiloxy-terminated phenylmethylsiloxanemethylhydro-siloxane copolymer;
   trimethylsiloxy-terminated methylcyanopropyl-siloxane-methylhydrosiloxane copolymer;
   dimethylsiloxy-terminated methylcyanopropyl-siloxane-methylhydrosiloxane copolymer;
   trimethylsiloxy-terminated 3,3,3-trifluoropropylmethylsiloxane methylhydrosiloxane copolymer;
   dimethylsiloxy-terminated 3,3,3-trifluoropropylmethylsiloxane methylhydrosiloxane copolymer;
   trimethylsiloxy-terminated 3-aminopropylmethyl siloxane-methylhydrosiloxane copolymer;
   dimethylsiloxy-terminated 3-aminopropylmethyl siloxane-methylhydrosiloxane copolymer;

trimethylsiloxy-terminated 2-phenylethylmethyl siloxane-methylhydrosiloxane copolymer;
dimethylsiloxy-terminated 2-phenylethylmethyl siloxane-methylhydrosiloxane copolymer;
trimethylsiloxy-terminated 2-(4-methylphenyl)-ethyl-methyl-siloxane-methylhydrosiloxane copolymer; and
dimethylsiloxy-terminated 2-(4-methylphenyl)-ethyl-methyl-siloxane-methylhydrosiloxane copolymer.

9. The curable composition according to claim 8, wherein said linear silicon compound is present in an amount of from about 10 to 90 weight percent, based on a total weight of silicon compounds present in said composition.

10. A curable composition comprising a crosslinkable organosilicon prepolymer hydrosilation reaction product comprising units derived from: a polyene having at least two hydrosilation reactive carbon-carbon double bonds, and
  (i) a cyclic silicon compound, having at least two hydrosilation reactive ≡SiH groups; and
  (ii) a linear silicon compound having the general formula:

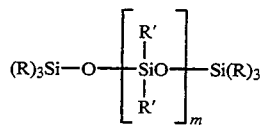

wherein R comprises at least one member selected from a group consisting of hydrogen, a substituted or unsubstituted saturated alkyl radical, and a substituted or unsubstituted phenyl radical, and R' comprises at least one member selected from a group consisting of hydrogen, a substituted or unsubstituted saturated alkyl radical, and a substituted or unsubstituted phenyl radical, and m is an integer from about 25 to 1000, at least one R' is hydrogen, and said linear silicon compound comprises at least two ≡SiH groups;
said curable composition comprising at least one member selected from the group consisting of said cyclic silicon compound having at least two hydrosilation reactive ≡SiH groups, and units derived from said cyclic silicon compound having at least two hydrosilation reactive ≡SiH groups, and at least one member selected from the group consisting of said linear silicon compound, and units derived from said linear silicon compound; and
a sum of said linear silicon compound and said units derived from said linear silicon compound is present in an amount of from about 5 to 95 weight percent, based on a total weight of silicon compounds and units derived from silicon compounds, present in said curable composition.

11. The curable composition according to claim 10, further comprising a hydrosilation catalyst.

12. The curable composition according to claim 11, wherein:
said polyene comprises a polycyclic polyene;
said cyclic silicon compound having the formula:

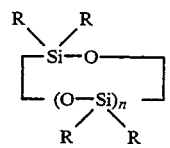

wherein R, which can be the same or different, comprises at least one member selected from the group consisting of hydrogen, a saturated, substituted, or unsubstituted alkyl or alkoxy radical, and a substituted or unsubstituted aromatic or aryloxy radical; n is an integer from 2 to about 20; and R is hydrogen on at least two of the silicon atoms; and
in said linear silicon compound, from about 5% to 50% of a total of R and R' are hydrogen.

13. The curable composition according to claim 12, wherein at least one member selected from the group consisting of said polyene, said cyclic silicon compound, and said linear silicon compound, has more than two hydrosilation reactive sites.

14. The curable composition according to claim 13, wherein m is an integer from about 25 to 80.

15. The curable composition according to claim 13, wherein a ratio of hydrosilation reactive carbon-carbon double bonds in the polyene, to ≡SiH groups in said cyclic silicon compound and said linear silicon compound, is from about 0.1:1 to about 1.5:1.

16. The curable composition according to claim 13, wherein the polycyclic polyene comprises dicyclopentadiene.

17. The curable composition according to claim 16, wherein said linear silicon compound comprises at least one member selected from the group consisting of:
trimethyl siloxy-terminated methylhydropolysiloxane;
dimethylsiloxy-terminated methylhydropolysiloxane;
trimethylsiloxy-terminated dimethylsiloxanemethyl-hydrosiloxane copolymer;
dimethylsiloxy-terminated dimethylsiloxanemethyl-hydrosiloxane copolymer;
trimethylsiloxy-terminated methyloctylsiloxaneme-thylhydro-siloxane copolymer;
dimethylsiloxy-terminated methyloctylsiloxaneme-thylhydro-siloxane copolymer;
dimethylsiloxy-terminated phenylmethylsiloxaneme-thylhydro-siloxane copolymer;
trimethylsiloxy-terminated methylcyanopropyl-silox-ane-methylhydrosiloxane copolymer;
dimethylsiloxy-terminated methylcyanopropyl-silox-ane-methylhydrosiloxane copolymer;
trimethylsiloxy-terminated 3,3,3-trifluoropropylme-thylsiloxane methylhydrosiloxane copolymer;
dimethylsiloxy-terminated 3,3,3-trifluoropropylme-thylsiloxane methylhydrosiloxane copolymer;
trimethylsiloxy-terminated 3-aminopropylmethyl siloxane-methylhydrosiloxane copolymer;
dimethylsiloxy-terminated 3-aminopropylmethyl siloxane-methylhydrosiloxane copolymer;
trimethylsiloxy-terminated 2-phenylethylmethyl siloxane-methylhydrosiloxane copolymer;
dimethylsiloxy-terminated 2-phenylethylmethyl siloxane-methylhydrosiloxane copolymer;
trimethylsiloxy-terminated 2-(4-methylphenyl)-ethyl-methyl-siloxane-methylhydrosiloxane copolymer; and dimethylsiloxy-terminated 2-(4-methylphenyl)-ethyl-methyl-siloxane-methylhydrosiloxane copolymer.

18. The curable composition according to claim 17, wherein said linear silicon compound is present in an amount of from about 10 to 90 weight percent, based on a total weight of silicon compounds present in said composition.

19. A cured composition, comprising a polymeric, hydrosilation reaction product of:
(A) a polyene having at least two hydrosilation reactive carbon-carbon double bonds;
(B) a cyclic silicon compound, having at least two hydro-silation reactive $\equiv$SiH groups; and
(C) a linear silicon compound having the general formula:

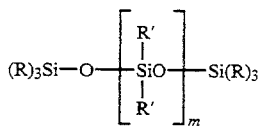

wherein R comprises at least one member selected from the group consisting of hydrogen, a substituted or unsubstituted saturated alkyl radical, and a substituted or unsubstituted phenyl radical, and R' comprises at least one member selected from the group consisting of hydrogen, a substituted or unsubstituted saturated alkyl radical, and a substituted or unsubstituted phenyl radical, and m is an integer from about 25 to 1000, at least one R' is hydrogen, and said linear silicon compound comprises at least two $\equiv$SiH groups; and
a sum of said linear silicon compound and said units derived from said linear silicon compound is present in an amount of from about 5 to 95 weight percent, based on a total weight of silicon compounds and units derived from silicon compounds, present in said curable composition.

20. The cured composition according to claim 19, further comprising a hydrosilation catalyst.

21. The cured composition according to claim 20, wherein:
said polyene comprises a polycyclic polyene;
said cyclic silicon compound having the formula:

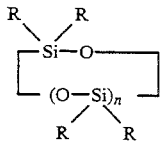

wherein R, which can be the same or different, comprises at least one member selected from the group consisting of hydrogen, a saturated, substituted, or unsubstituted alkyl or alkoxy radical, and a substituted or unsubstituted aromatic or aryloxy radical; n is an integer from 2 to about 20; and R is hydrogen on at least two of the silicon atoms; and
in said linear silicon compound, from about 5% to 50% of a total of R and R' are hydrogen.

22. The cured composition according to claim 21, wherein at least one member selected from the group consisting of said polyene, said cyclic silicon compound, and said linear silicon compound, has more than two hydrosilation reactive sites.

23. The cured composition according to claim 22, wherein m is an integer from about 25 to 80.

24. The cured composition according to claim 22, wherein a ratio of hydrosilation reactive carbon-carbon double bonds in the polyene, to $\equiv$SiH groups in said cyclic silicon compound and said linear silicon compound, is from about 0.1:1 to about 1.5:1.

25. The cured composition according to claim 22, wherein the polycyclic polyene comprises dicyclopentadiene.

26. The cured composition according to claim 25, wherein said linear silicon compound comprises at least one member selected from the group consisting of:
trimethylsiloxy-terminated methylhydropolysiloxane;
dimethylsiloxy-terminated methylhydropolysiloxane;
trimethylsiloxy-terminated dimethylsiloxanemethylhydrosiloxane copolymer;
dimethylsiloxy-terminated dimethylsiloxanemethylhydrosiloxane copolymer;
trimethylsiloxy-terminated methyloctylsiloxanemethylhydro-siloxane copolymer;
dimethylsiloxy-terminated methyloctylsiloxanemethylhydro-siloxane copolymer;
dimethylsiloxy-terminated phenylmethylsiloxanemethylhydro-siloxane copolymer;
trimethylsiloxy-terminated methylcyanopropyl-siloxane-methylhydrosiloxane copolymer;
dimethylsiloxy-terminated methylcyanopropyl-siloxane-methylhydrosiloxane copolymer;
trimethylsiloxy-terminated 3,3,3-trifluoropropylmethylsiloxane methylhydrosiloxane copolymer;
dimethylsiloxy-terminated 3,3,3-trifluoropropylmethylsiloxane methylhydrosiloxane copolymer;
trimethylsiloxy-terminated 3-aminopropylmethyl siloxane-methylhydrosiloxane copolymer;
dimethylsiloxy-terminated 3-aminopropylmethyl siloxane-methylhydrosiloxane copolymer;
trimethylsiloxy-terminated 2-phenylethylmethyl siloxane-methylhydrosiloxane copolymer;
dimethylsiloxy-terminated 2-phenylethylmethyl siloxane-methylhydrosiloxane copolymer;
trimethylsiloxy-terminated 2-(4-methylphenyl)-ethyl-methyl-siloxane-methylhydrosiloxane copolymer; and
dimethylsiloxy-terminated 2-(4-methylphenyl)-ethyl-methyl-siloxane-methylhydrosiloxane copolymer.

27. The cured composition according to claim 26, wherein said linear silicon compound is present in an amount of from about 10 to 90 weight percent, based on a total weight of silicon compounds present in said composition.

28. A process for preparing a cured composition, comprising:
combining (A) a polyene having at least two hydrosilation reactive carbon-carbon double bonds, (B) a cyclic silicon compound, having at least two hydro-silation reactive $\equiv$SiH groups, (C) a linear silicon compound having the general formula:

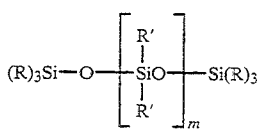

wherein R comprises at least one member selected from the group consisting of hydrogen, a substituted or unsubstituted saturated alkyl radical, and a substituted or unsubstituted phenyl radical, and R' comprises at least one member selected from the group consisting of hydrogen, a substituted or unsubstituted saturated alkyl radical, and a substituted or unsubstituted phenyl radical, and m is an integer from about 25 to 1000, at least one R' is hydrogen, and said linear silicon compound comprises at least two $\equiv$SiH groups, said linear silicon compound being present in an amount of from about 5 to 95 weight percent, based on a total weight of silicon compounds present in said curable composition; and polymerizing said polyene, said cyclic silicon compound, and said linear silicon compound.

29. The process according to claim 28, wherein a hydrosilation catalyst is added to the polyene, the cyclic silicon compound, and the linear silicon compound, before polymerization is carried out.

30. The process according to claim 29, wherein said polyene comprises a polycyclic polyene; said cyclic silicon compound having the formula:

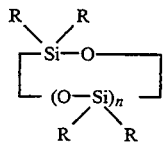

wherein R, which can be the same or different, comprises at least one member selected from the group consisting of hydrogen, a saturated, substituted, or unsubstituted alkyl or alkoxy radical, and a substituted or unsubstituted aromatic or aryloxy radical; n is an integer from 2 to about 20; and R is hydrogen on at least two of the silicon atoms; and in said linear silicon compound, from about 5% to 50% of a total of R and R' are hydrogen.

31. The process according to claim 30, wherein at least one member selected from the group consisting of said polyene, said cyclic silicon compound, and said linear silicon compound, has more than two hydrosilation reactive sites.

32. The process according to claim 31, wherein m is an integer from about 25 to 80.

33. The process according to claim 31, wherein a ratio of hydrosilation reactive carbon-carbon double bonds in the polyene, to $\equiv$SiH groups in said cyclic silicon compound and said linear silicon compound, is from about 0.1:1 to about 1.5:1.

34. The process according to claim 31, wherein the polycyclic polyene comprises dicyclopentadiene.

35. The process according to claim 34, wherein said linear silicon compound comprises at least one member selected from the group consisting of:
trimethylsiloxy-terminated methylhydropolysiloxane;
dimethylsiloxy-terminated methylhydropolysiloxane;
trimethylsiloxy-terminated dimethylsiloxanemethylhydrosiloxane copolymer;
dimethylsiloxy-terminated dimethylsiloxanemethylhydrosiloxane copolymer;
trimethylsiloxy-terminated methyloctylsiloxanemethylhydro-siloxane copolymer;
dimethylsiloxy-terminated methyloctylsiloxanemethylhydro-siloxane copolymer;
dimethylsiloxy-terminated phenylmethylsiloxanemethylhydro-siloxane copolymer;
trimethylsiloxy-terminated methylcyanopropyl-siloxane-methylhydrosiloxane copolymer;
dimethylsiloxy-terminated methylcyanopropyl-siloxane-methylhydrosiloxane copolymer;
trimethylsiloxy-terminated 3,3,3-trifluoropropylmethylsiloxane methylhydrosiloxane copolymer;
dimethylsiloxy-terminated 3,3,3-trifluoropropylmethylsiloxane methylhydrosiloxane copolymer;
trimethylsiloxy-terminated 3-aminopropylmethyl siloxane-methylhydrosiloxane copolymer;
dimethylsiloxy-terminated 3-aminopropylmethyl siloxane-methylhydrosiloxane copolymer;
trimethylsiloxy-terminated 2-phenylethylmethyl siloxane-methylhydrosiloxane copolymer;
dimethylsiloxy-terminated 2-phenylethylmethyl siloxane-methylhydrosiloxane copolymer;
trimethylsiloxy-terminated 2-(4-methylphenyl)-ethylmethyl-siloxane-methylhydrosiloxane copolymer; and
dimethylsiloxy-terminated 2-(4-methylphenyl)-ethylmethyl-siloxane-methylhydrosiloxane copolymer.

36. The process according to claim 35, wherein said linear silicon compound is present in an amount of from about 10 to 90 weight percent, based on a total weight of silicon compounds present in said composition.

37. A process for preparing a cured composition from a curable composition comprising:
a prepolymer comprising units derived from a polyene having at least 2 hydrosilation-reactive carbon-carbon double bonds, and units derived from
(A) a cyclic silicon compound having at least two hydrosilation reactive $\equiv$SiH groups; and
(B) a linear silicon compound having the general formula:

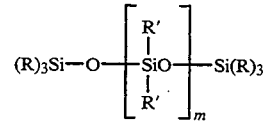

wherein R comprises at least one member selected from the group consisting of hydrogen, a substituted or unsubstituted saturated alkyl radical, and a substituted or unsubstituted phenyl radical, and R' comprises at least one member selected from the group consisting of hydrogen, a substituted or unsubstituted saturated alkyl radical, and a substituted or unsubstituted phenyl radical, and m is an integer from about 25 to 1000, at least one R' is hydrogen, and said linear silicon compound comprises at least two $\equiv$SiH groups;
said curable composition comprising at least one member selected from a group consisting of said cyclic silicon compound, and units derived from said cyclic silicon compound;
said curable composition comprising at least one member selected from a group consisting of said linear silicon compound, and units derived from said linear silicon compound, a sum of said linear silicon compound and said units derived from said linear silicon compound is present in an amount of from about 5 to 95 weight percent, based on a total weight of silicon compounds and units derived from silicon compounds, present in said curable composition; and said process comprising polymerizing the curable composition by subjecting the curable composition to a hydrosilation polymerization reaction.

38. The process according to claim 37, wherein a hydrosilation catalyst is used in the preparation of said prepolymer and in the polymerization of said curable composition.

39. The process according to claim 38, wherein:
said polyene comprises a polycyclic polyene;
said cyclic silicon compound having the formula:

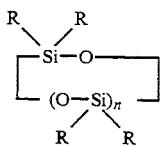

wherein R, which can be the same or different, comprises at least one member selected from the group consisting of hydrogen, a saturated, substituted, or unsubstituted alkyl or alkoxy radical, and a substituted or unsubstituted aromatic or aryloxy radical; n is an integer from 2 to about 20; and R is hydrogen on at least two of the silicon atoms; and
in said linear silicon compound, from about 5% to 50% of a total of R and R' are hydrogen.

40. The process according to claim 39, wherein at least one member selected from the group consisting of said polyene, said cyclic silicon compound, and said linear silicon compound, has more than two hydrosilation reactive sites.

41. The process according to claim 40, wherein m is an integer from about 25 to 80.

42. The process according to claim 40, wherein a ratio of hydrosilation reactive carbon-carbon double bonds in the polyene, to ≡SiH groups in said cyclic silicon compound and said linear silicon compound, is from about 0.1:1 to about 1.5:1.

43. The process according to claim 40, wherein said polycyclic polyene comprises dicyclopentadiene.

44. The process according to claim 43, wherein said linear silicon compound comprises at least one member selected from the group consisting of:
trimethylsiloxy-terminated methylhydropolysiloxane;
dimethylsiloxy-terminated methylhydropolysiloxane;
trimethylsiloxy-terminated dimethylsiloxanemethylhydrosiloxane copolymer;
dimethylsiloxy-terminated dimethylsiloxanemethylhydrosiloxane copolymer;
trimethylsiloxy-terminated methyloctylsiloxanemethylhydro-siloxane copolymer;
dimethylsiloxy-terminated methyloctylsiloxanemethylhydro-siloxane copolymer;
dimethylsiloxy-terminated phenylmethylsiloxanemethylhydro-siloxane copolymer;
trimethylsiloxy-terminated methylcyanopropyl-siloxane-methylhydro-siloxane copolymer;
dimethylsiloxy-terminated methylcyanopropyl-siloxane-methylhydrosiloxane copolymer;
trimethylsiloxy-terminated 3,3,3-trifluoropropylmethylsiloxane methylhydrosiloxane copolymer;
dimethylsiloxy-terminated 3,3,3-trifluoropropylmethylsiloxane methylhydrosiloxane copolymer;
trimethylsiloxy-terminated 3-aminopropylmethyl siloxane-methylhydrosiloxane copolymer;
dimethylsiloxy-terminated 3-aminopropylmethyl siloxane-methylhydrosiloxane copolymer;
trimethylsiloxy-terminated 2-phenylethylmethyl siloxane-methylhydrosiloxane copolymer;
dimethylsiloxy-terminated 2-phenyl ethylmethyl siloxane-methylhydrosiloxane copolymer;
trimethylsiloxy-terminated 2-(4-methylphenyl)-ethyl-methyl-siloxane-methylhydrosiloxane copolymer; and
dimethylsiloxy-terminated 2-(4-methylphenyl)-ethyl-methyl-siloxane-methylhydrosiloxane copolymer.

45. The process according to claim 44, wherein said linear silicon compound is present in an amount of from about 10 to 90 weight percent, based on a total weight of silicon compounds present in said composition.

* * * * *